United States Patent
Ishii et al.

(10) Patent No.: US 11,867,647 B2
(45) Date of Patent: *Jan. 9, 2024

(54) METHOD FOR MEASURING TEREPHTHALIC ACID CONTENT AND SOLVENT FOR USE IN MEASUREMENT

(71) Applicant: Nippon Telegraph and Telephone Corporation, Tokyo (JP)

(72) Inventors: Azusa Ishii, Tokyo (JP); Takashi Miwa, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 657 days.

This patent is subject to a terminal disclaimer.

(21) Appl. No.: 17/056,274

(22) PCT Filed: May 10, 2019

(86) PCT No.: PCT/JP2019/018734
§ 371 (c)(1),
(2) Date: Nov. 17, 2020

(87) PCT Pub. No.: WO2019/225356
PCT Pub. Date: Nov. 28, 2019

(65) Prior Publication Data
US 2021/0181131 A1 Jun. 17, 2021

(30) Foreign Application Priority Data
May 21, 2018 (JP) ................................. 2018-096928

(51) Int. Cl.
*G01N 24/08* (2006.01)

(52) U.S. Cl.
CPC .................................. *G01N 24/082* (2013.01)

(58) Field of Classification Search
CPC ....... G01N 24/082; G01N 24/08; G01R 33/46
See application file for complete search history.

(56) References Cited

FOREIGN PATENT DOCUMENTS

| JP | 2005193426 A | 7/2005 |
|---|---|---|
| JP | 2006083124 A | 3/2006 |

OTHER PUBLICATIONS

Karayannidis, G. P., et al. "Poly(ethylene terephthalate) recycling and recovery of pure terephthalic acid by alkaline hydrolysis." Advances in Polymer Technology, vol. 21, No. 4, May 3, 2002, pp. 250-259, https://doi.org/10.1002/adv.10029 (Year: 2002).*
T. Nishioka, "Introduction to Polymer Analysis," Polymer Analysis, Nuclear Magnetic Resonance Spectroscopy, Apr. 10, 2010, pp. 136-137.

* cited by examiner

*Primary Examiner* — Jennifer Wecker
*Assistant Examiner* — Ali Husain Faraz
(74) *Attorney, Agent, or Firm* — Slater Matsil, LLP

(57) ABSTRACT

In a first step, a sample liquid is fabricated by mixing a sample formed of a polyester or decomposition products of a polyester into a solvent. The solvent used here contains chloroform and 2,2,2-trifluoroethanol and has an organic base added thereto. The organic base is at least one of a primary amine, a secondary amine, a tertiary amine and a heterocyclic amine. In a second step, the amount of terephthalic acid in the sample liquid is measured through a nuclear magnetic resonance spectroscopy aiming at hydrogen atoms

10 Claims, 3 Drawing Sheets

[Correction based on Article 26, 07 06, 2019]

[Correction based on Article 26, 07 06, 2019]

[Correction based on Article 26, 07 06, 2019]

[Correction based on Article 26, 07 06, 2019]

METHOD FOR MEASURING TEREPHTHALIC ACID CONTENT AND SOLVENT FOR USE IN MEASUREMENT

CROSS-REFERENCE TO RELATED APPLICATIONS

This application is a national phase entry of PCT Application No. PCT/JP2019/018734, filed on May 10, 2019, which claims priority to Japanese Application No. 2018-096928, filed on May 21, 2018, which applications are hereby incorporated herein by reference.

TECHNICAL FIELD

The present invention relates to a method for measuring the terephthalic acid content that is for measuring terephthalic acid contained in a polyester or its decomposition products, and to a solvent for measurement that is used in the measurement method.

BACKGROUND

Polyesters, such as thermoplastic polyesters, are used in a variety of applications, taking advantage of their excellent characteristics of achieving both strength and flexibility. For example, polyethylene terephthalate (PET) is used in films, fibers and bottles for beverages, some of which are also recycled.

When a polyester that contains terephthalic acid as a raw material is degraded by heat or light, terephthalic acid is produced as a decomposition product due to the degradation. Accordingly, the terephthalic acid content of a polyester product that contains terephthalic acid as a raw material is considered to be one of the effective indicators for post-production quality control of the product (see Patent Literature 1) and for the investigation of long term reliability.

In addition, a variety of recycling technologies have been developed for polyesters, but in a recycling technology that chemically decomposes polyesters into oligomers or monomers, it is important to figure out the composition of decomposition products in order to reuse them as raw materials. In a recycling process of decomposing a polyester that contains terephthalic acid as a raw material into oligomers or monomers, it is particularly important to figure out the content of terephthalic acid, which is a typical decomposition product (see Patent Literature 2).

As described above, it is important to figure out the terephthalic acid content of a polyester that contains terephthalic acid as a raw material or of decomposition products of a polyester that contains terephthalic acid as a raw material. However, at present, there is no simple quantification method for the terephthalic acid content of a resin, and analysis using liquid chromatography is generally performed (see Patent Literatures 1 and 2).

CITATION LIST

Patent Literature

Patent Literature 1: Japanese Patent Laid-Open No. 2005-193426;
Patent Literature 2: Japanese Patent Laid-Open No. 2006-83124

Non-Patent Literature

Non-Patent Literature 1: T. Nishioka, "Introduction to Polymer Analysis", KODANSHA LTD., 1st printing, Chapter 3, Part 2, page 136, published in 2010.

SUMMARY

Technical Problem

By the way, when quantification of the terephthalic acid content of a polyester or of decomposition products of a polyester is carried out with liquid chromatography, it takes several tens of minutes to measure a single sample, and if startup and shutdown operations of the device are included as well, it takes several hours to perform the overall quantification operation. A technology that can measure the terephthalic acid content with a simpler measurement method has been demanded.

As a simple measurement method that does not require startup and shutdown operations of the device for every use and that can also perform the measurement in a few minutes, mention may be made of a nuclear magnetic resonance spectroscopy (1H NMR measurement) aiming at hydrogen atoms (1H). However, with this measurement method currently used (see Non-Patent Literature 1), there has been a problem that the peak of terephthalic acid cannot be found and cannot be measured when a polyester or decomposition products of a polyester are measured.

The present invention has been made in order to solve the problems as described above, and an object of the present invention is to enable measurement of the terephthalic acid content of a polyester or of decomposition products of a polyester through a nuclear magnetic resonance spectroscopy aiming at hydrogen atoms.

Means for Solving the Problem

A method for measuring the terephthalic acid content according to the present invention comprises: a first step of mixing a sample formed of a polyester or decomposition products of a polyester into a solvent, thereby fabricating a sample liquid; and a second step of measuring the amount of terephthalic acid in the sample liquid through a nuclear magnetic resonance spectroscopy aiming at hydrogen atoms, and the solvent comprises chloroform and 2,2,2-trifluoroethanol and has an organic base added thereto.

In the above method for measuring the terephthalic acid content, the organic base may be at least one of a primary amine, a secondary amine, a tertiary amine and a heterocyclic amine.

In the above method for measuring the terephthalic acid content, in the solvent, 1,1,1,3,3,3-hexafluoro-2-propanol may be mixed in addition to chloroform and 2,2,2-trifluoroethanol.

In the above method for measuring the terephthalic acid content, when the mixing ratio of chloroform, 2,2,2-trifluoroethanol and 1,1,1,3,3,3-hexafluoro-2-propanol in the solvent is defined as A:B:C, $A/C>1$, $8>(A+B)/C>3$ and $5>(A-B)/C>2$ may be satisfied.

A solvent for measurement according to the present invention is a solvent for measurement used in a method for measuring the terephthalic acid content in which the amount of terephthalic acid in a sample liquid obtained by mixing a sample formed of a polyester or decomposition products of a polyester into a solvent is measured through a nuclear magnetic resonance spectroscopy aiming at hydrogen atoms, and the solvent comprises chloroform and 2,2,2-trifluoroethanol and has an organic base added thereto.

In the above solvent for measurement, the organic base may be at least one of a primary amine, a secondary amine, a tertiary amine and a heterocyclic amine.

In the above solvent for measurement, 1,1,1,3,3,3-hexafluoro-2-propanol may be mixed in addition to chloroform and 2,2,2-trifluoroethanol.

In the above solvent for measurement, when the mixing ratio of chloroform, 2,2,2-trifluoroethanol and 1,1,1,3,3,3-hexafluoro-2-propanol is defined as A:B:C, A/C>1, 8>(A+B)/C>3 and 5>(A−B)/C>−2 may be satisfied.

Effects of the Invention

As described above, since the present invention uses a solvent that comprises chloroform and 2,2,2-trifluoroethanol and has an organic base added thereto, an excellent effect can be obtained that the terephthalic acid content of a polyester or of decomposition products of a polyester can be measured through a nuclear magnetic resonance spectroscopy aiming at hydrogen atoms.

DETAILED DESCRIPTION OF ILLUSTRATIVE EMBODIMENTS

Figure 1:
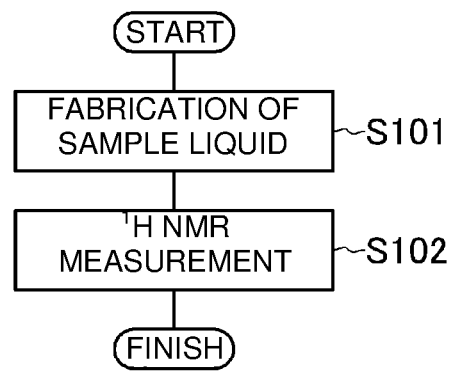
FIG. 1 is a flowchart for describing a method for measuring the terephthalic acid content according to the present invention.

Hereinafter, a method for measuring the terephthalic acid content according to an embodiment of the present invention will be described with reference to FIG. 1.

At first, in a first step S101, a sample liquid is fabricated by mixing a sample formed of a polyester or decomposition products of a polyester into a solvent. The solvent used here comprises chloroform and 2,2,2-trifluoroethanol and has an organic base added thereto. The organic base is at least one of a primary amine, a secondary amine, a tertiary amine and a heterocyclic amine. Note that the polyester aimed at has thermoplasticity.

In addition, when the amines mentioned above are used as the organic base, in the above solvent, 1,1,1,3,3,3-hexafluoro-2-propanol may be mixed in addition to chloroform and 2,2,2-trifluoroethanol. In this case, when the mixing ratio of chloroform, 2,2,2-trifluoroethanol and 1,1,1,3,3,3-hexafluoro-2-propanol in the solvent is defined as A:B:C, A/C>1, 8>(A+B)/C>3 and 5>(A−B)/C>2 may be satisfied.

Next, in a second step S102, the amount of terephthalic acid in the sample liquid is measured through a nuclear magnetic resonance spectroscopy aiming at hydrogen atoms. The temperature conditions for the measurement may be 30 to 50° C.

According to the embodiment mentioned above, measurement of the terephthalic acid content of a polyester or of decomposition products of a polyester is enabled through a nuclear magnetic resonance spectroscopy (1H NMR measurement) aiming at hydrogen atoms.

Here, how the present inventors have reached embodiments of the present invention will be described. When the present inventors attempted to quantify terephthalic acid in a polyester through 1H NMR measurement, it was found that the peak of terephthalic acid is not confirmed. As a result of diligent researches on this situation, it was ascertained that the problem mentioned above is caused by the overlapping of the proton peak of aromatic rings in polyester polymers and oligomers and the proton peak of terephthalic acid.

According to the measurement using the solvent according to the embodiment mentioned above, in the 1H NMR measurement, the proton peak of aromatic rings in polyester polymers and oligomers can be separated from the proton peak of terephthalic acid, and it becomes possible to measure the terephthalic acid content.

Hereinafter, more detailed description will be given using the results of experiments and the like.

NMR Measurement $^1$H NMR (300 MHz) was measured with a nuclear magnetic resonance device, Oxford, from Varian, Inc. The sample was dissolved in a measurement solvent (about 0.9 mL), an organic base (about 0.3 mg) was added, and the measurement was conducted at T° C. The chemical shift δ was expressed in ppm, with the peak of Me$_4$Si being 0 ppm. The coupling constant (J) is expressed in Hz, and the signal pattern is denoted by br (broad), s (singlet), d (doublet), t (triplet), q (quartet) and m (multiplet).

Sample

As the polyester that contains terephthalic acid as a raw material, for example, polyethylene terephthalate (PET), polybutylene terephthalate (PBT), polyneopentyl terephthalate (PNT), and copolymers thereof were used as the sample. In addition, not only terephthalic acid, but also isophthalic acid may be contained in a portion of the raw materials. Alternatively, decomposition products of a polyester that contains terephthalic acid as a raw material, for example, chemically decomposed PET, were used as the sample.

In Comparative Examples and Examples, any of the followings was used as the sample. Note that Mn is the number average molecular weight.

Sample-1—PET (Mn: about 14000), about 3 mg

Sample-2—Terephthalic acid, about 3 mg

Sample-3—Mixture of PET (Mn: about 14,000), about 2.7 mg and terephthalic acid, about 0.1 mg Sample-4—Mixture of PET (Mn: about 1,500), about 2.7 mg and terephthalic acid, about 0.1 mg Measurement Solvent The following deuterated solvents were mixed for use in an arbitrary volume ratio.

Deuterated chloroform [containing Me$_4$Si 0.03% (v/v)] CDCl$_3$ 2,2,2-Trifluoroethanol-2d (TFEA-2d)

1,1,1,3,3,3-Hexafluoro-2-propanol-2d (HFIP-2d)

Organic Base

In Comparative Examples and Examples, any of the following organic bases was used.

sopropylamine (primary amine)

Diethylamine (secondary amine)

N-Ethyldiisopropylamine (tertiary amine)

Pyridine (heterocyclic amine)

Measurement Object Peak

In Comparative Examples and Examples, the proton peaks represented by the following chemical formulas were measured.

(a): Protons derived from terephthalic acid in the repeated structure of a polyester (b) and (b'): Protons of an amine derivative of the terephthalic acid terminal of a polyester (c): Protons of an amine derivative of terephthalic acid

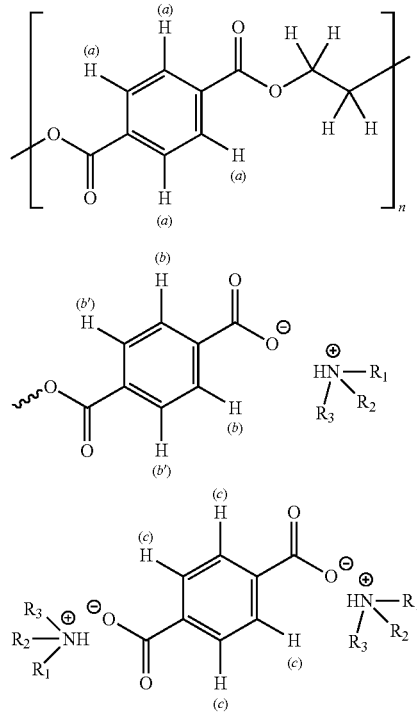

Formula 1

Quantification Method of Terephthalic Acid

When the peak of (c) was measured separately from other peaks in the 1H NMR measurement, the molar concentration of terephthalic acid relative to the entire terephthalic acid structures in the sample, $C_{TPA}$ [mol %], was calculated according to "$C_{TPA}=(c)/\{(a)+(b)+(b')+(c)\}\times 100$" using the integrated value for each peak.

Comparative Example 1

In Comparative Example 1, measurement of the PET sample is performed under the measurement condition used in NMR measurement for the purpose of quantifying the terephthalic acid terminal of a polyester.

Figure 2:
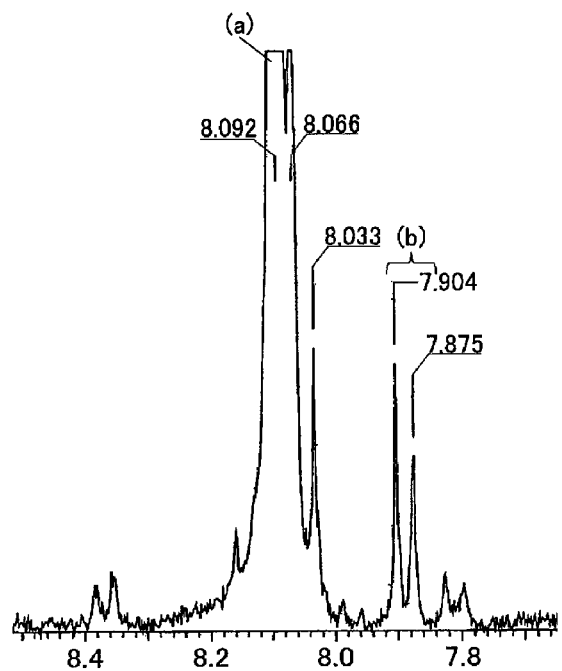
FIG. 2 is a characteristic diagram showing peaks obtained by performing $^1$H NMR measurement at T=50° C. for a sample of PET dissolved in a mixed solvent of CDCl$_3$/HFIP-2d, to which isopropylamine was added.

About 3 mg of Sample-1: PET (Mn: about 14,000) was dissolved in a mixed solvent of CDCl$_3$/HFIP-2d (volume ratio of 1:1), isopropylamine (about 0.3 mg) was added, and the 1H NMR measurement was carried out at T=50° C., thereby confirming the following peaks (see FIG. 2).

(a): δ8.09 (s, 4H)

(b): δ7.89 (d, J=8.7 Hz, 2H)

Comparative Example 2

Figure 3:
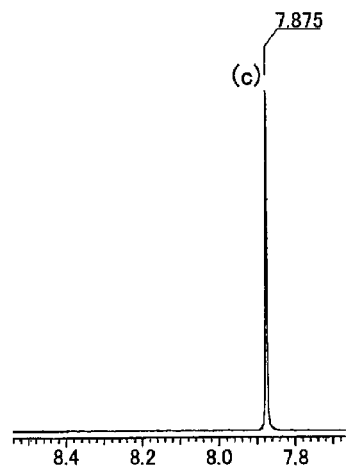
FIG. 3 is a characteristic diagram showing a peak obtained by performing $^1$H NMR measurement at T=50° C. for a sample of terephthalic acid dissolved in a mixed solvent of CDCl$_3$/HFIP-2d, to which isopropylamine was added.

In Comparative Example 2, measurement of terephthalic acid is performed under the same conditions as in Comparative Example 1. Sample-2: terephthalic acid (about 3 mg) was measured under the same conditions as in Comparative Example 1, and the following peak was confirmed (see FIG. 3).

(c): δ7.88 (s, 4H)

Comparative Example 3

In Comparative Example 3, measurement of a mixed sample of PET and terephthalic acid is performed under the same conditions as in Comparative Examples 1 and 2. When Sample-3: mixture of PET (Mn: about 14,000), about 2.7 mg and terephthalic acid, about 0.1 mg was measured under the same conditions as in Comparative Examples 1 and 2, the peaks of (b) and (c) were overlapped.

In Comparative Example 1, the peaks of the doublet in (b) decline on the right shoulder, whereas in Comparative Example 3, (c) overlaps with the peak on the side of higher magnetic field of the doublet, resulting in a rise in the right shoulder.

Figure 4:
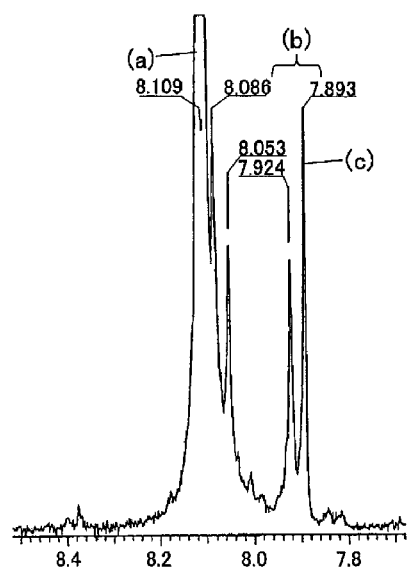
FIG. 4 is a characteristic diagram showing peaks obtained by performing $^1$H NMR measurement at T=50° C. for a sample of PET and terephthalic acid dissolved in a mixed solvent of CDCl$_3$/HFIP-2d, to which isopropylamine was added.

Note that there has been no reported case so far indicating that the peaks of (b) and (c) are overlapped when the sample is dissolved in a mixed solvent of [CDCl$_3$/HFIP-2d (volume ratio of 1:1)] under the present measurement condition, isopropylamine (about 0.3 mg) is added, and the 1H NMR measurement is performed at T=50° C. Through Comparative Examples 1 to 3, the present inventors revealed for the first time that separation of the peaks of (b) and (c) is a problem for quantifying terephthalic acid with the 1H NMR measurement (see FIG. 4).

(a): δ8.11 (s, 4H)

(b): δ7.91 (d, J=9.3 Hz, 2H)

(c): δ7.89 (s, 4H)

Comparative Example 4

In Comparative Example 4, measurement is carried out changing the parameters of solvent mixing ratio, type of organic base, temperature and the like from those of Comparative Example 3.

Sample-3: mixture of PET (Mn: about 14,000), about 2.7 mg and terephthalic acid, about 0.1 mg was measured changing the parameters of solvent mixing ratio, type of organic base, temperature and the like from those of Comparative Example 3. Whether (b) and (c) can be separated or not in each measurement condition is shown in the following Table 1.

TABLE 1

Table 1 - 1H NMR measurement results with mixed solvent of CDCl₃/HFIP-2d

| Entry No. | CDCl₃/ HFIP-2d A:C | Organic base | Measurement temperature [° C.] | Separation of peaks of (b) and (c) |
|---|---|---|---|---|
| 1 (Comparative Example 3, reshown) | 1:1 | Isopropylamine | 50 | x |
| 2 | 1:4 | Isopropylamine | 50 | x |
| 3 | 4:1 | Isopropylamine | 50 | x |
| 4 | 1:1 | Diethylamine | 50 | x |
| 5 | 1:1 | N-Ethyldiiso-propylamine | 50 | x |
| 6 | 1:1 | Pyridine | 50 | x |
| 7 | 1:1 | Isopropylamine | 55 | x |
| 8 | 1:1 | Isopropylamine | 40 | x |
| 9 | 1:1 | Isopropylamine | 25 | x |

Comparative Example 5

In Comparative Example 5, measurement is carried out changing the types of solvents from those of Comparative Example 4. Changing from the mixed solvent of CDCl₃/HFIP-2d (1:1) used in Comparative Example 3, a mixed solvent of CDCl₃/TFEA-2d (1:1) was used to measure Sample-3: mixture of PET (Mn: about 14,000), about 2.7 mg and terephthalic acid, about 0.1 mg.

TFEA is a solvent that hardly dissolves PET, and is thus not used for the purpose of PET measurement in the NMR measurement, which requires dissolution of the sample. However, the present inventors focused on the fact that TFEA is an organic solvent that is not as acidic as HFIP but has high acidity, and performed Comparative Example 5 in order to confirm the effect of TFEA on the peak shift.

In Comparative Example 5, the mixed solvent was added to Sample-3 and isopropylamine was then added thereto, but a residue remaining undissolved was present at this stage. Therefore, this measurement sample was heated to about 50° C. for about 10 minutes, but the residue still remained. As such, when the 1H NMR measurement was carried out in the presence of solid components remaining undissolved, measurement data was obtained for a dissolved part of the sample, and it was confirmed that the peaks of (b) and (c) can be separated.

Note that it is necessary to dissolve the sample in the 1H NMR measurement, and in the above measurement, while a dissolved part of the sample was measured, the PET resin remaining undissolved was not measured. Therefore, it is inappropriate to calculate the concentration of terephthalic acid based on the obtained spectrum.

(a): δ8.09 (s, 4H)
(b): δ7.90 (d, J=8.7 Hz, 2H)
(c): δ7.85 (s, 4H)

Hereinafter, Examples to which the present invention was applied will be described.

Example 1

In Example 1, measurement was carried out changing the type of the sample from that of Comparative Example 5. In Comparative Example 5, Sample-3, a mixture of a PET resin with Mn of about 14,000 and terephthalic acid, was used as the sample. It is considered that the reason for the undissolution of the sample in Comparative Example 5 is because the PET resin is not dissolved well in TFEA. However, the acidity of TFEA is relatively high due to the electron withdrawing effect of the trifluoromethyl group, and therefore, the present inventors considered that, as long as it has a relatively low molecular weight, even a PET resin can be dissolved in TFEA and can be subjected to the 1H NMR measurement.

Based on the above observation, in Example 1, the sample of Comparative Example 5 was changed from Sample-3: mixture of PET (Mn: about 14,000), about 2.7 mg and terephthalic acid, about 0.1 mg to Sample-4: mixture of PET (Mn: about 1,500), about 2.7 mg and terephthalic acid, about 0.1 mg, and the ¹H NMR measurement was carried out.

Specifically, Sample-4 was dissolved in a mixed solvent of CDCl₃/TFEA-2d (volume ratio of 1:1), isopropylamine (about 0.3 mg) was added, and the 1H NMR measurement was carried out at T=50° C.

Figure 5:
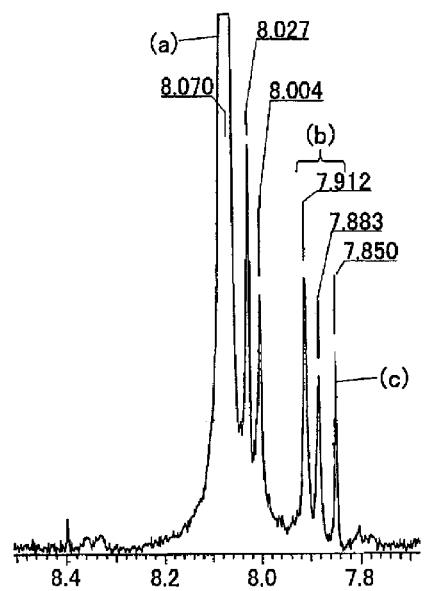
FIG. 5 is a characteristic diagram showing peaks obtained by performing $^1$H NMR measurement at T=50° C. for a sample of PET and terephthalic acid dissolved in a mixed solvent of CDCl$_3$/TFEA-2d, to which isopropylamine was added.

As a result, the 1H NMR measurement was carried out with no occurrence of undissolved sample, and the peaks of (b) and (c) were separated, as shown in FIG. 5.

(a): δ8.07 (s, 4H)
(b): δ7.90 (d, J=8.7 Hz, 2H)
(c): δ7.85 (s, 4H)

When substituting the integrated values of peaks into the following formula, "$C_{TPA}=(c)/\{(a)+(b)+(b')+(c)\}\times 100=1.89/44.28\times 100=4.3$". This coincided well with the molar concentration of terephthalic acid relative to the entire aromatic rings derived from terephthalic acid in Sample-4, which is calculated from the following formula.

(the number of moles of terephthalic acid in Sample-4)/{(the number of moles of aromatic rings derived from terephthalic acid contained in the PET resin of Sample-4)+(the number of moles of terephthalic acid in Sample-4)}×100=(0.1 mg/166 g/mol)/{(2.7 mg/192 g/mol)+(0.1 mg/166 g/mol)}×100=4.3

According to the present Example, it was found that, when a PET resin sample has a relatively low molecular weight and the sample is dissolved in a mixed solvent of CDCl₃/TFEA-2d, the concentration of terephthalic acid can be determined.

Comparative Example 6

In Comparative Example 6, measurement is carried out changing the types of solvents and the mixing ratio thereof from those of Comparative Example 5. In Comparative Example 5, the mixed solvent of CDCl₃/TFEA-2d (volume ratio of 1:1) was used and the peaks of (b) and (c) were separated, but the PET resin in Sample-3 was not dissolved in the mixed solvent. Since TFEA hardly dissolves PET resins, the present inventors decided to investigate, as the mixed solvent, a ternary mixed solvent in which HFIP, which can dissolve PET resins, is also mixed into CDCl₃ and TFEA. In the NMR measurement, it is most common to use a solvent with a single composition as the measurement solvent, and when there is a problem in the solubility of the sample or the like, a binary mixed solvent may be used, but it is not common to use a ternary mixed solvent.

The results of measurements at different mixing ratios of the solvents are shown in Table 2. In all conditions, the organic base is isopropylamine and the measurement temperature is 50° C.

In Entry No. 11, CDCl₃/TFEA-2d/HFIP-2d (1:1:1) was used, and it was difficult to separate (b) from (c). Therefore, in Entry Nos. 11 and 12, the proportion of TFEA was increased in order to enhance the effect of peak shifting by TFEA, but the peaks of (b) and (c) were not separated. In Entry No. 13, it was confirmed that the solubility of the sample was decreased, and therefore, it was determined that it is inappropriate to further increase the proportion of TFEA, which decreases the solubility of the PET resin.

Next, in Entry Nos. 14 and 15, the proportion of chloroform in the mixed solvent was increased. In No. 14, the peaks of (b) and (c) were not separated, but in No. 15, two peaks were observed to be slightly apart from each other, albeit incompletely, compared to No. 11 and others.

TABLE 2

Table 2 - $^1$H NMR measurement results with mixed solvent of CDCl$_3$/TFEA-2d/HFIP-2d

| Entry No. | CDCl$_3$/TFEA-2d/HFIP-2d A:B:C | Dissolution of sample | Separation of peaks of (b) and (c) |
|---|---|---|---|
| 1 (Comparative Example 3, reshown) | 1:0:1 | ○ | x |
| 10 (Comparative Example 4, reshown) | 1:1:0 | x | ○ |
| 11 | 1:1:1 | ○ | x |
| 12 | 1:2:1 | ○ | x |
| 13 | 1:3:1 | Δ | x |
| 14 | 2:1:1 | ○ | x |
| 15 | 3:1:1 | ○ | Δ |

Example 2

In Example 2, measurement was carried out changing the mixing ratios of solvents from those of Comparative Example 6. The 1H NMR measurement was carried out for (Sample-3) changing the mixing ratios of the ternary mixed solvent used in Comparative Example 6. The results are shown in Table 3.

For all of Entry No. 15 to Entry No. 19, the sample was dissolved and the peaks of (b) and (c) were separated. Also, when $C_{TPA}$ was determined from the integrated values of peaks, it coincided well with the molar concentration of terephthalic acid relative to the entire aromatic rings derived from terephthalic acid in (Sample-3), which is calculated from the following formula.

(the number of moles of terephthalic acid in Sample-3)/{(the number of moles of aromatic rings derived from terephthalic acid contained in the PET resin of Sample-3)+(the number of moles of terephthalic acid in Sample-3)}×100=(0.1 mg/166 g/mol)/{(2.7 mg/192 g/mol)+(0.1 mg/166 g/mol)}×100=4.3

TABLE 3

| Entry No. | CDCl$_3$/TFEA-2d/HFIP-2d A:B:C | Dissolution of sample | Separation of peaks of (b) and (c) | $C_{TPA}$ calculated value [mol %] |
|---|---|---|---|---|
| 1 (Comparative Example 3, reshown) | 1:0:1 | ○ | x | — |
| 9 (Comparative Example 4, reshown) | 1:1:0 | x | ○ | — |
| 11 (Comparative Example 6, reshown) | 1:1:1 | ○ | x | — |
| 13 (Comparative Example 6, reshown) | 1:3:1 | Δ | x | — |
| 15 (Comparative Example 6, reshown) | 3:1:1 | ○ | Δ | — |
| 16 | 4:1:1 | ○ | ○ | 4.1 |
| 17 | 3:2:1 | ○ | ○ | 4.5 |
| 18 | 2:2:1 | ○ | ○ | 4.3 |
| 19 | 3:3:1 | ○ | ○ | 4.2 |
| 20 | 2:3:1 | ○ | ○ | 4.3 |

Figure 6:
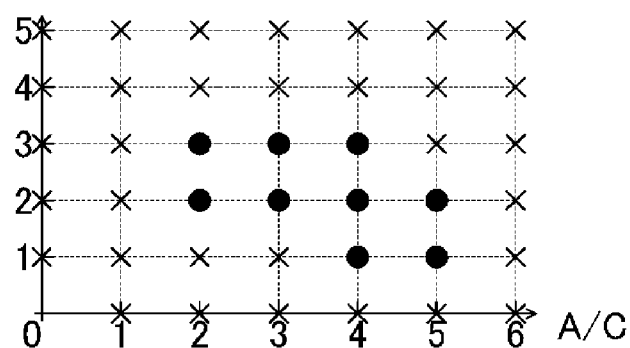
FIG. 6 is an explanatory diagram showing, for the mixing ratio of chloroform, 2,2,2-trifluoroethanol and 1,1,1,3,3,3-hexafluoro-2-propanol (A:B:C), the relationship among A/C, B/C and the separation between the proton peak of an amine derivative of the terephthalic acid terminal of a polyester and the proton peak of an amine derivative of terephthalic acid.

Here, in the solvent according to the above embodiment, the mixing ratio of chloroform, 2,2,2-trifluoroethanol and 1,1,1,3,3,3-hexafluoro-2-propanol is defined as A:B:C. In addition, as shown in FIG. 6, A/C is taken on the horizontal axis and B/C is taken on the vertical axis, and the points where (b) and (c) were separated are marked with "○", and the points where they were not separated and where dissolution of the sample was insufficient are marked with "x". From FIG. 6, for sufficient separation of (b) and (c), it is necessary to satisfy the conditions "A/C>1, 8>(A+B)/C>3 and 5>(A−B)/C>−2".

Example 3

In Example 3, measurement was carried out changing the type of the organic base and the measurement temperature from those of Example 2. Based on Entry No. 18 [CDCl$_3$/TFEA-2d/HFIP-2d (2:2:1) was used as the mixed solvent], the measurement was carried out changing the type of the organic base and the measurement temperature. The results are shown in Table 4.

For all of Entry No. 21 to Entry No. 26, the sample was dissolved and the peaks of (b) and (c) were separated. Also, when $C_{TPA}$ was determined from the integrated values of peaks, it coincided well with the molar concentration of terephthalic acid relative to the entire aromatic rings derived from terephthalic acid in (Sample-3), 4.3.

It was confirmed that the organic base to be added is not limited to isopropylamine (primary amine) and may be diethylamine (secondary amine), N-ethyldiisopropylamine (tertiary amine) or pyridine (heterocyclic amine). It can be readily analogized that n-propylamine, n-butylamine, sec-butylamine, tert-butylamine, n-pentylamine, diisopropylamine, dibutylamine, triethylamine, tributylamine, aziridine, pyrrolidine, pyrrole, piperidine, imidazole, triazole, pyrimidine and the like are also available.

In addition, with respect to the measurement temperature, based on the fact that the boiling point of each solvent is as follows: chloroform 61° C.; TFEA 72° C.; and HFIP 58° C., and also the solvents are easily admixed at a higher temperature, the measurement was also performed at 55° C., 40° C. and 30° C. and it was confirmed that the measurement may be carried out at any of these temperatures.

TABLE 4

| Entry No. | Organic base | Measurement temperature [° C.] | Separation of peaks of (b) and (c) | $C_{TPA}$ calculated value [mol %] |
|---|---|---|---|---|
| 18 (Example 2, reshown) | Isopropylamine | 50 | ○ | 4.3 |
| 21 | Diethylamine | 50 | ○ | 4.5 |
| 22 | N-Ethyldiisopropylamine | 50 | ○ | 4.2 |
| 23 | Pyridine | 50 | ○ | 4.1 |
| 24 | Isopropylamine | 55 | ○ | 4.1 |
| 25 | Isopropylamine | 40 | ○ | 4.3 |
| 26 | Isopropylamine | 30 | ○ | 4.4 |

When quantification of the terephthalic acid content of a polyester or of decomposition products of a polyester is carried out with liquid chromatography, it takes several tens of minutes to measure a single sample, and if startup and shutdown operations of the device are included as well, it takes several hours to perform the overall quantification operation. As a measurement technology that is simpler than the liquid chromatography, mention may be made of NMR.

In the NMR measurement, it is necessary to dissolve the sample in a solvent, and in the polyester measurement, a mixed solvent of 1,1,1,3,3,3-hexafluoro-2-propanol and chloroform, which dissolves a polyester well, is commonly used. However, the present inventors confirmed that, with the NMR measurement using the above mixed solvent, it is difficult to separate the peak of terephthalic acid from those of other components and terephthalic acid cannot be quantified.

2,2,2-trifluoroethanol is a solvent that hardly dissolves polyesters and is generally not used in the NMR measurement for polyesters. However, in embodiments of the present invention, the present inventors focused on the fact that 2,2,2-trifluoroethanol has relatively high acidity, and considered that it may be applicable as the measurement solvent for polyesters if it is used as a mixed solvent. Then, by using a mixed solvent that contains 2,2,2-trifluoroethanol, adding an organic base thereto, and carrying out the measurement, simple quantification of the terephthalic acid content of a polyester was achieved.

Although 2,2,2-trifluoroethanol hardly dissolves polyesters, it was possible to perform the present measurement with a mixed solvent of 2,2,2-trifluoroethanol and chloroform as long as the polyester has a relatively low molecular weight. In addition, with respect to a polyester that has a larger molecular weight than that and is not dissolved in a mixed solvent of 2,2,2-trifluoroethanol and chloroform, although a mixed solvent that is normally used for the NMR measurement is a binary mixed solvent, it was confirmed that the measurement can be carried out by using a ternary mixed solvent of 2,2,2-trifluoroethanol, 1,1,1,3,3,3-hexafluoro-2-propanol and chloroform in embodiments of the present invention. The ternary mixed solvent has a problem in the solubility of the sample or the separation of peaks depending on the mixing ratio of solvents, and therefore, embodiments of the present invention revealed a desired mixing ratio.

As described above, since embodiments of the present invention use a solvent that contains chloroform and 2,2,2-trifluoroethanol and has an organic base added thereto, measurement of the terephthalic acid content of a polyester or of decomposition products of a polyester is enabled through a nuclear magnetic resonance spectroscopy aiming at hydrogen atoms.

Note that the present invention is not limited to the embodiments described above, and it is obvious that those having ordinary skill in the art can make many modifications and combinations without departing from the technical idea of the invention.

The invention claimed is:

1. A method for measuring terephthalic acid content, the method comprising:
 mixing a sample into a solvent to fabricate a sample liquid, wherein the sample is formed of a polyester or decomposition products of a polyester, wherein the solvent comprises chloroform and 2,2,2-trifluoroethanol, and wherein the solvent has an organic base added thereto; and
 measuring an amount of terephthalic acid in the sample liquid through a nuclear magnetic resonance spectroscopy aiming at hydrogen atoms.

2. The method according to claim 1, wherein the organic base is a primary amine, a secondary amine, a tertiary amine, or a heterocyclic amine.

3. The method according to claim 2, wherein the solvent further comprises 1,1,1,3,3,3-hexafluoro-2-propanol mixed with the chloroform and the 2,2,2-trifluoroethanol.

4. The method according to claim 3, wherein a mixing ratio of chloroform to 2,2,2-trifluoroethanol to 1,1,1,3,3,3-hexafluoro-2-propanol in the solvent is defined as A:B:C, and wherein A/C>1, 8>(A+B)/C>3, and 5>(A−B)/C>−2 are satisfied.

5. A solvent for measurement, the solvent comprising:
 chloroform; and
 2,2,2-trifluoroethanol, wherein the solvent has an organic base added thereto, wherein the solvent is adapted for measuring a terephthalic acid content in a sample liquid, wherein the sample liquid is obtained by mixing a sample formed of a polyester or decomposition products of a polyester into the solvent, and wherein the terephthalic acid content is measured through a nuclear magnetic resonance spectroscopy aiming at hydrogen atoms.

6. The solvent according to claim 5, wherein the organic base is a primary amine, a secondary amine, a tertiary amine, or a heterocyclic amine.

7. The solvent according to claim 6 further comprising 1,1,1,3,3,3-hexafluoro-2-propanol mixed with the chloroform and the 2,2,2-trifluoroethanol.

8. The solvent according to claim 7, wherein a mixing ratio of chloroform to 2,2,2-trifluoroethanol to 1,1,1,3,3,3-hexafluoro-2-propanol is defined as A:B:C, and wherein A/C>1.

9. The solvent according to claim 8, wherein 8>(A+B)/C>3.

10. The solvent according to claim 8, wherein 5>(A−B)/C>2.

* * * * *